(12) United States Patent
Ando et al.

(10) Patent No.: US 10,699,967 B2
(45) Date of Patent: Jun. 30, 2020

(54) CO-INTEGRATION OF HIGH CARRIER MOBILITY PFET AND NFET DEVICES ON THE SAME SUBSTRATE USING LOW TEMPERATURE CONDENSATION

(71) Applicant: International Business Machines Corporation, Armonk, NY (US)

(72) Inventors: Takashi Ando, Tuckahoe, NY (US); Pouya Hashemi, White Plains, NY (US); Choonghyun Lee, Rensselaer, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/021,377

(22) Filed: Jun. 28, 2018

(65) Prior Publication Data

US 2020/0006146 A1 Jan. 2, 2020

(51) Int. Cl.
*H01L 21/8242* (2006.01)
*H01L 21/8258* (2006.01)
(Continued)

(52) U.S. Cl.
CPC ...... *H01L 21/8258* (2013.01); *H01L 21/2255* (2013.01); *H01L 27/0924* (2013.01); *H01L 21/8252* (2013.01); *H01L 21/823821* (2013.01)

(58) Field of Classification Search
CPC .................................................. H01L 21/8258
(Continued)

(56) References Cited

U.S. PATENT DOCUMENTS 8,029,905 B2  10/2011  Kouvetakis et al.
8,460,990 B2   6/2013  Kim et al.
(Continued)

FOREIGN PATENT DOCUMENTS

CN  103904122 A  7/2014
CN  103915504 A  7/2014
(Continued)

OTHER PUBLICATIONS

Ando et al., "Co-Integration of High Carrier Mobililty PFET and NFET Devices on the Same Substrate Using Low Temperature Condensation," U.S. Appl. No. 16/564,705, filed Sep. 9, 2019.
(Continued)

*Primary Examiner* — Ajay Arora
(74) *Attorney, Agent, or Firm* — Cantor Colburn LLP; Vazken Alexanian

(57) ABSTRACT

Embodiments of the invention are directed to a method of fabricating semiconductor devices. A non-limiting example of the method includes forming a first fin in a p-type field effect transistor (PFET) region of a substrate, wherein the first fin includes a first material that includes a first type of semiconductor material at a first concentration level. A second fin is formed in an n-type FET (NFET) region of the substrate, wherein the second fin includes a second semiconductor material that includes a III-V compound. Condensation operations are performed, wherein the condensation operations are configured to increase the first concentration level in at least a portion of the first fin to a targeted final concentration level.

14 Claims, 12 Drawing Sheets

(51) Int. Cl.
*H01L 27/092* (2006.01)
*H01L 21/225* (2006.01)
*H01L 21/8252* (2006.01)
*H01L 21/8238* (2006.01)

(58) Field of Classification Search
USPC .......................................... 257/190; 438/249
See application file for complete search history.

(56) References Cited

U.S. PATENT DOCUMENTS

| | | | |
|---|---|---|---|
| 9,040,391 B2 | 5/2015 | Damlencourt et al. | |
| 9,209,285 B2 | 12/2015 | Berger | |
| 9,257,556 B2 | 2/2016 | Xu et al. | |
| 9,330,984 B1* | 5/2016 | Leobandung | H01L 21/845 |
| 9,349,809 B1 | 5/2016 | Cheng et al. | |
| 9,391,181 B2 | 7/2016 | Chu-Kung et al. | |
| 9,461,174 B2 | 10/2016 | Loubet et al. | |
| 9,496,260 B1 | 11/2016 | Balakrishnan et al. | |
| 10,229,856 B2* | 3/2019 | Ando | H01L 21/324 |
| 2005/0181592 A1* | 8/2005 | Tweet | H01L 21/02381 |
| | | | 438/602 |
| 2007/0099353 A1 | 5/2007 | Thean et al. | |
| 2007/0221956 A1 | 9/2007 | Inaba | |
| 2013/0049121 A1 | 2/2013 | Baldauf et al. | |
| 2014/0154877 A1 | 6/2014 | Besser et al. | |
| 2015/0206965 A1 | 7/2015 | Cheng et al. | |
| 2015/0311207 A1* | 10/2015 | Ching | H01L 27/0924 |
| | | | 257/192 |
| 2016/0049335 A1 | 2/2016 | Liu et al. | |
| 2016/0141368 A1 | 5/2016 | Cheng et al. | |
| 2016/0190303 A1 | 6/2016 | Liu et al. | |
| 2016/0190317 A1 | 6/2016 | Liu et al. | |
| 2016/0268378 A1 | 9/2016 | Hashemi et al. | |
| 2017/0104012 A1* | 4/2017 | Cheng | H01L 27/1211 |
| 2017/0162447 A1 | 6/2017 | Glass et al. | |

FOREIGN PATENT DOCUMENTS

| | | | |
|---|---|---|---|
| CN | 104183487 A | | 12/2014 |
| CN | 104934472 A | | 9/2015 |
| JP | 2007238413 A | * | 9/2007 |
| TW | 549295 B | | 9/2016 |
| WO | 2016113640 A1 | | 7/2016 |

OTHER PUBLICATIONS

List of IBM Patents or Patent Applications Treated As Related; Date Filed: Sep. 9, 2019, 2 pages.
PCT International Search Report and Written Opinion (ISRWO); Application No. PCT/IB2018/053282; Dated Sep. 19, 2018; 9 pages.
Wang et al. "Desorption kinetics of GeO from $GeO_2$/Ge structure," Journal of Applied Physics 108, (2010), pp0 054104-1-054104-8.
Ando et al., "Dual Channel CMOS Having Common Gate Stacks," U.S. Appl. No. 15/596,629, filed May 16, 2017.
Ando et al., "Dual Channel CMOS Having Common Gate Stacks," U.S. Appl. No. 15/813,958, filed Nov. 15, 2017.
Deshpande et al., "Advanced 3D Monolithic Hybrid CMOS with Sub-50 nm Gate Inverters Featuring Replacement Metal Gate (RMG)-InGaAs nFETs on SiGe-OI Fin pFETs," 2015 IEEE International Electron Devices Meeting (IEDM), IEEE, 2015, 4 pages.
Hashemi el al., "High-Mobility High-Ge-Content $Si_{1-x}Ge_x$-OI PMOS FinFETs with Fins Formed Using 3D Germanium Condensation with Ge Fraction up to x~ 0.7, Scaled EOT~ 8.5 Å and~ 10nm Fin Width," 2015 Symposium on VLSI Circuits, IEEE, 2015, 2 pages.
List of IBM Patents or Patent Applications Treated As Related; Date Filed: Jun. 28, 2018, 2 pages.
Takagi et al., "Carrier-Transport-Enhanced Channel CMOS for Improved Power Consumption and Performance," IEEE Transactions on Electron Devices 55.1, 2008, pp. 21-39.

* cited by examiner

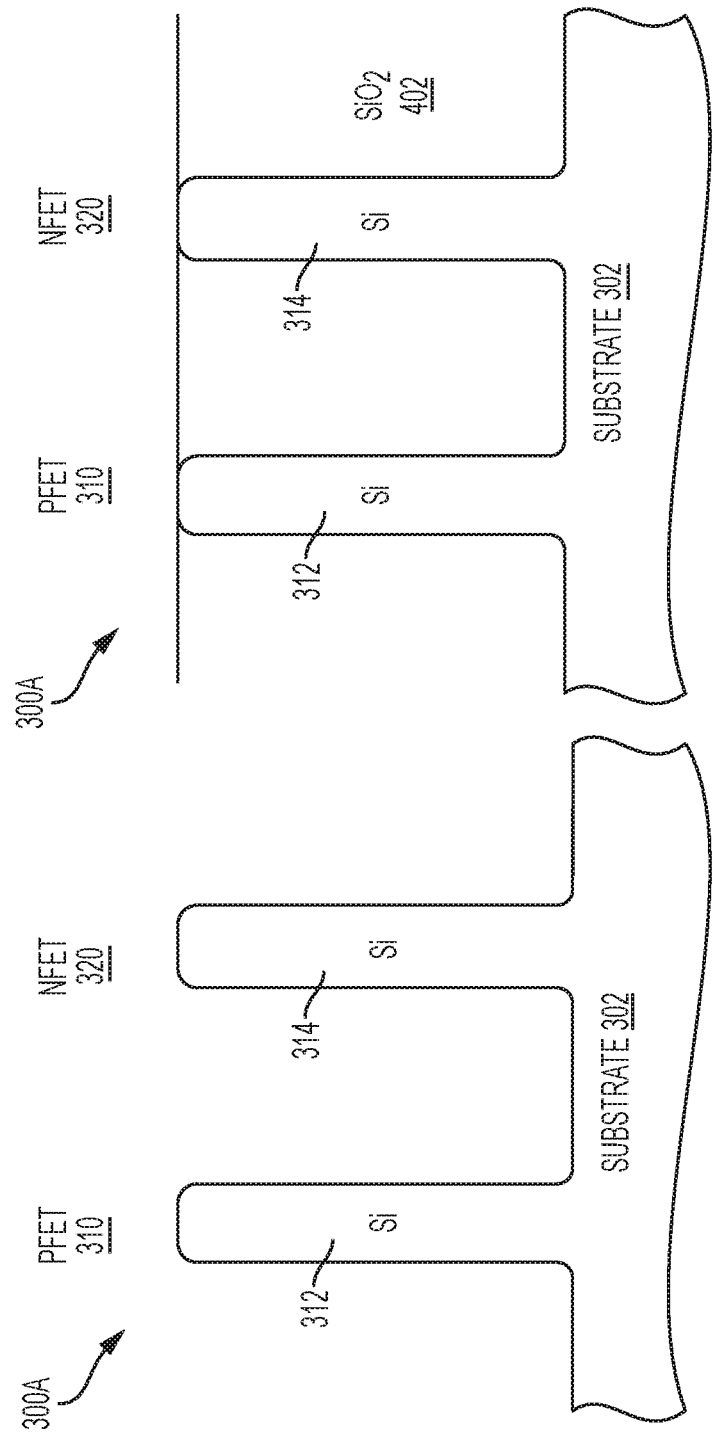

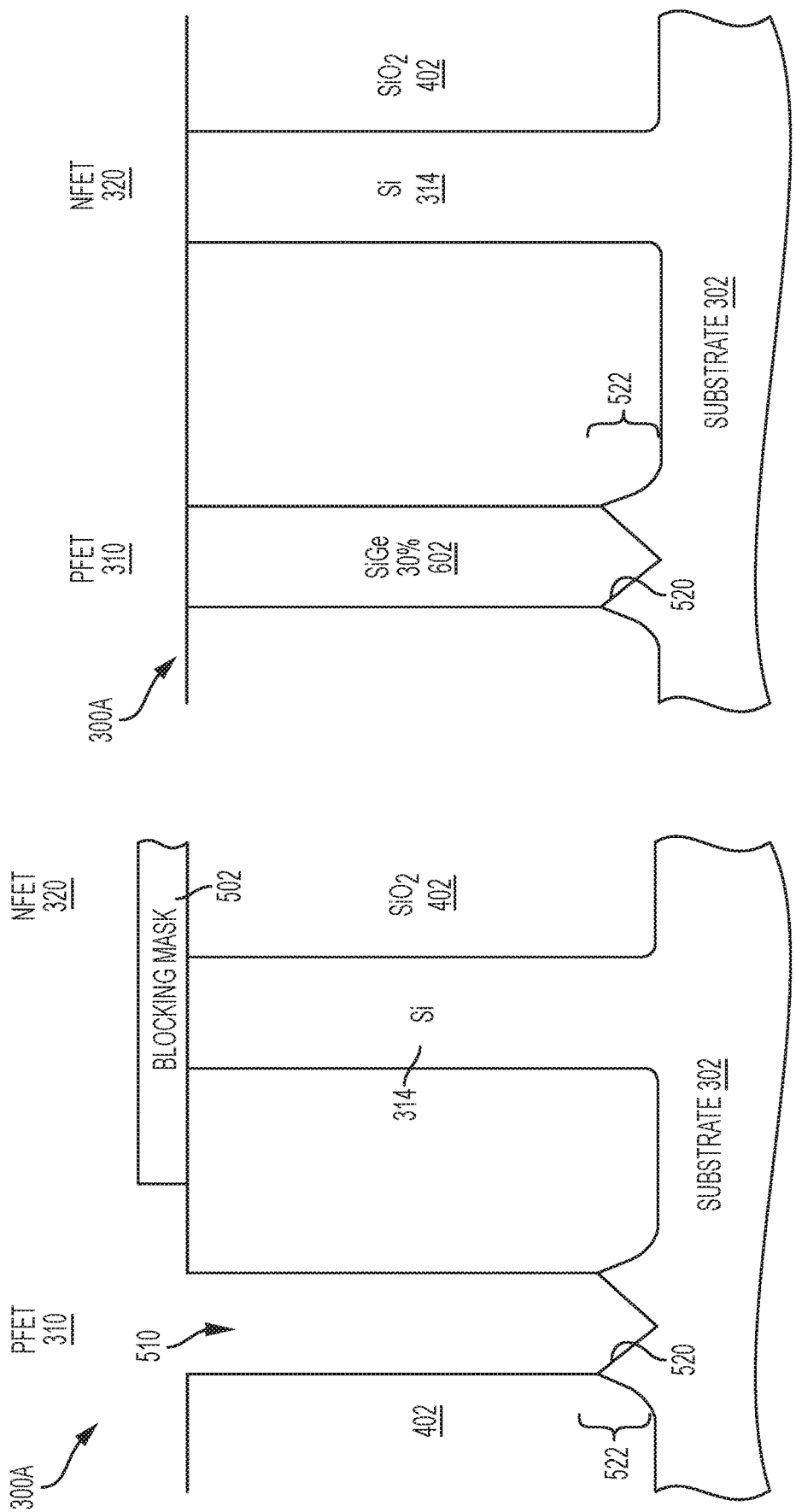

CO-INTEGRATION OF HIGH CARRIER MOBILITY PFET AND NFET DEVICES ON THE SAME SUBSTRATE USING LOW TEMPERATURE CONDENSATION

BACKGROUND

The present invention relates in general to semiconductor devices for use in integrated circuits (ICs). More specifically, the present invention relates to improved fabrication methods and resulting structures for the co-integration of high carrier (e.g., holes) mobility p-type field effect transistors (PFETs) and high carrier (e.g., electrons) mobility n-type field effect transistors (NFETs) on the same substrate using a low temperature (e.g., a temperature<about 550 Celsius) condensation process.

Transistors are fundamental device elements of modern digital processors and memory devices. A transistor type that has emerged within the metal-oxide-semiconductor field-effect transistor (MOSFET) family of transistors, and which shows promise for scaling to ultra-high density and nanometer-scale channel lengths, is a so-called fin-type FET (FinFET) device. FinFETs are non-planar, three-dimensional (3D) devices that include a fin-shaped channel with a gate formed along the sidewalls and top surface of the fin channel.

Although forming the fin channel from silicon (Si) provides benefits, forming the fin channel from materials other than Si can provide higher carrier mobility in the channel. For example, to provide a higher carrier mobility than Si, it has been proposed to form the fin channel of a p-type FinFET from silicon germanium (SiGe), and form the fin channel of an n-type FinFET from III-V compound materials. III-V compound semiconductors are obtained by combining group III elements (e.g., Al, Ga, In) with group V elements (e.g., N, P, As, Sb). In addition to improving carrier mobility, channels formed from SiGe or III-V compound materials introduce strain at the interface between the SiGe or III-V material and the underlying Si substrate.

SUMMARY

Embodiments of the invention are directed to a method of fabricating semiconductor devices. A non-limiting example of the method includes forming a first fin in a p-type field effect transistor (PFET) region of a substrate, wherein the first fin includes a first material that includes a first type of semiconductor material at a first concentration level. A second fin is formed in an n-type FET (NFET) region of the substrate, wherein the second fin includes a second semiconductor material that includes a III-V compound. Condensation operations are performed, wherein the condensation operations are configured to increase the first concentration level in at least a portion of the first fin to a targeted final concentration level.

Embodiments of the invention are directed to a method of fabricating semiconductor devices. A non-limiting example of the method includes forming a first trench over a PFET region of a substrate. A first fin is formed in the first trench, wherein the first fin includes a first material that includes a first type of semiconductor material at a first concentration level. A second fin is formed in an NFET region of the substrate, wherein the second fin includes a second semiconductor material that includes a III-V compound. Condensation operations are performed, wherein the condensation operations are configured to increase the first concentration level in a portion of the first fin to a targeted final concentration level, and wherein a bottom portion of the first fin includes the first material that includes the first type of semiconductor material at the first concentration level.

Embodiments of the invention are directed to a set of fin-based field effect transistor (FET) devices formed on a substrate. A non-limiting example of the devices includes a first fin formed in a PFET region of the substrate, wherein the first fin includes a top region, a central region and a bottom region. The top region of the first fin includes a first material configured to include a first type of semiconductor material at a first concentration level. The central region of the first fin includes the first material configured to include the first type of semiconductor material at a second concentration level. The bottom region of the first fin includes a second material configured to include a second type of semiconductor material. A second fin is formed in an NFET region of the substrate, wherein the second fin includes a top region, a central region, and a bottom region. The top region of the second fin includes a third material configured to include a III-V compound. The central region of the second fin includes a fourth material configured to include a buffer material. The bottom region of the second fin includes the second material configured to include the second type of semiconductor material.

Additional features and advantages are realized through techniques described herein. Other embodiments and aspects are described in detail herein. For a better understanding, refer to the description and to the drawings.

BRIEF DESCRIPTION OF THE DRAWINGS

The subject matter which is regarded as embodiments is particularly pointed out and distinctly claimed in the claims at the conclusion of the specification. The foregoing and other features and advantages of the embodiments are apparent from the following detailed description taken in conjunction with the accompanying drawings in which:

FIGS. 3-13 depict the results of fabrication operations for forming high mobility PFET fin channels and high mobility NFET fin channels on the same substrate according to embodiments of the invention, in which:

FIG. 3 depicts a cross-sectional view of a semiconductor device after a fabrication operation according to embodiments of the invention;

FIG. 4 depicts a cross-sectional view of a semiconductor device after a fabrication operation according to embodiments of the invention;

FIG. 5 depicts a cross-sectional view of a semiconductor device after a fabrication operation according to embodiments of the invention;

FIG. 6 depicts a cross-sectional view of a semiconductor device after a fabrication operation according to embodiments of the invention;

FIG. 7 depicts a cross-sectional view of a semiconductor device after a fabrication operation according to embodiments of the invention;

FIG. 8 depicts a cross-sectional view of a semiconductor device after a fabrication operation according to embodiments of the invention;

FIG. 9 depicts a cross-sectional view of a semiconductor device after a fabrication operation according to embodiments of the invention;

FIG. 10 depicts a cross-sectional view of a semiconductor device after a fabrication operation according to embodiments of the invention;

FIG. 11 depicts a cross-sectional view of a semiconductor device after a fabrication operation according to embodiments of the invention;

FIG. 12 depicts a cross-sectional view of a semiconductor device after a fabrication operation according to embodiments of the invention; and FIG. 13 depicts a cross-sectional view of a semiconductor device after a fabrication operation according to embodiments of the invention;

DETAILED DESCRIPTION

It is understood in advance that, although this detailed description includes examples of how aspects of the invention can be implemented to form fin channels from high mobility SiGe and high mobility III-V compound materials in p-type and n-type FinFET devices, implementation of the teachings recited herein are not limited to a particular type of FET structure or combination of semiconductor materials. Rather, embodiments of the present invention are capable of being implemented in conjunction with any other type of fin-based transistor device (e.g., vertical FETs) or semiconductor material, now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the fabrication of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, semiconductor devices are typically formed using active regions of a wafer. The active regions are defined by isolation regions used to separate and electrically isolate adjacent semiconductor devices. For example, in an integrated circuit having a plurality of metal oxide semiconductor field effect transistors (MOSFETs), each MOSFET has a source and a drain that are formed in an active region of a semiconductor layer by implanting n-type or p-type impurities in the layer of semiconductor material. Disposed between the source and the drain is a channel (or body) region. Disposed above the body region is a gate electrode. The gate electrode and the body are spaced apart by a gate dielectric layer.

Figure 1:
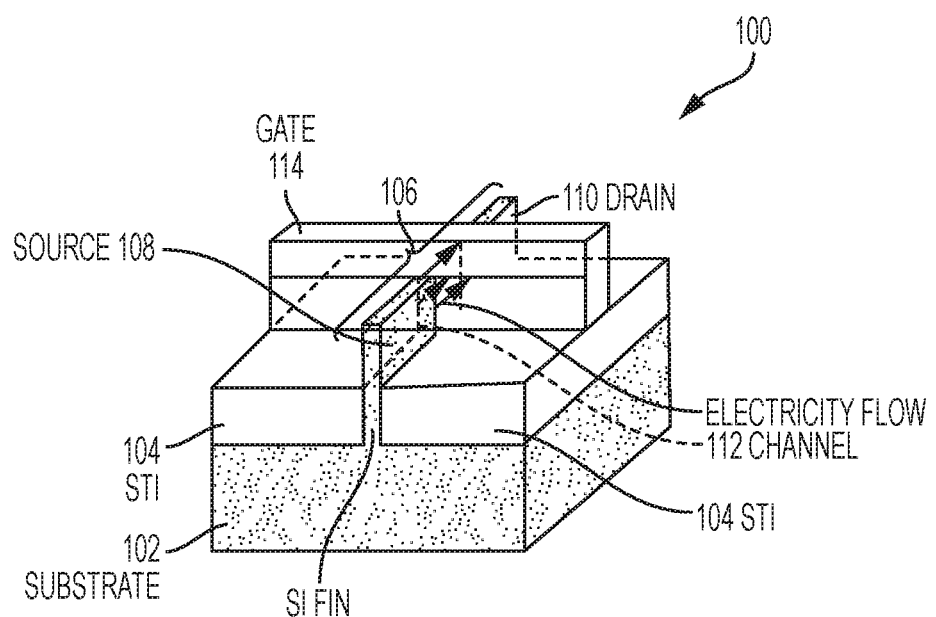
FIG. 1 depicts a three-dimensional view of an example configuration of a known FinFET device.

One particularly advantageous type of MOSFET is known generally as a fin-type field effect transistor (FinFET), an example of which is shown in FIG. 1 as a three-dimensional view of a FinFET 100. The basic electrical layout and mode of operation of FinFET 100 do not differ significantly from a traditional field effect transistor. FinFET 100 includes a semiconductor substrate 102, an STI layer 104, a fin 106 and a gate 114, configured and arranged as shown. Fin 106 includes a source region 108, a drain region 110 and a channel region 112, wherein gate 114 extends over the top and sides of channel region 112. For ease of illustration, a single fin is shown in FIG. 1. In practice, FinFET devices are fabricated having multiple fins formed on STI 104 and substrate 102. Substrate 102 can be silicon, STI 104 can be an oxide (e.g., silicon oxide), and fin 106 can be silicon that has been enriched to a desired concentration level of germanium. Gate 114 controls the source to drain current flow (labeled ELECTRICITY FLOW in FIG. 1).

In contrast to planar MOSFETs, source 108, drain 110 and channel 112 are built as a three-dimensional bar on top of STI layer 104 and semiconductor substrate 102. The three-dimensional bar is the aforementioned "fin 106," which serves as the body of the device. The gate electrode is then wrapped over the top and sides of the fin, and the portion of the fin that is under the gate electrode functions as the channel. The source and drain regions are the portions of the fin on either side of the channel that are not under the gate electrode. The dimensions of the fin establish the effective channel length for the transistor.

Forming FET channels from strained semiconductor material increases the mobility of charge carriers (i.e., electrons or holes) passing through channel's semiconductor lattice. Incorporating strain into the FET channel stretches the crystal lattice, thereby increasing charge carrier mobility in the channel so that the FET device becomes a more responsive switch. Introducing a compressive strain into a PFET transistor tends to increase hole mobility in the channel, resulting in a faster switching response to changes in voltage applied to the transistor gate. Similarly, introducing a tensile strain into an NFET transistor tends to increase electron mobility in the channel, also resulting in a faster switching response. Forming the FET channel from materials other than Si can introduce strain and provide higher carrier mobility in the channel. For example, to provide higher carrier mobility than Si, it has been proposed to form the fin channel of a p-type FinFET from SiGe, and form the fin channel of an n-type FinFET from III-V compound materials. III-V compound semiconductors are obtained by combining group III elements (e.g., Al, Ga, In) with group V elements (e.g., N, P, As, Sb).

There are many ways to introduce tensile or compressive strain into transistors for both planar devices and FinFETs. In general, such techniques typically entail incorporating into the device epitaxial layers of one or more materials having crystal lattice dimensions or geometries that differ slightly from those of the silicon substrate. The epitaxial layers can be made of SiGe or III-V compound materials, for example. Such epitaxial layers can be incorporated into source and drain regions, into the transistor gate that is used to modulate current flow in the channel, or into the channel itself, which is a portion of the fin. For example, one way to introduce strain into the channel is to replace bulk silicon in the channel with silicon compounds such as SiGe, for example. Because Si—Ge bonds are longer than Si—Si bonds, there is more open space in a SiGe lattice. The presence of Ge atoms having longer bonds stretches the lattice, causing internal strain. Electrons can move more freely through a lattice that contains elongated Si—Ge and Ge—Ge bonds, than through a lattice that contains shorter Si—Si bonds. Replacing Si atoms with SiGe atoms can be accomplished during a controlled process of epitaxial crystal growth, in which a new SiGe crystal layer is grown from the surface of a bulk silicon crystal, while maintaining the same crystal structure of the underlying bulk silicon crystal.

Strain and mobility effects can be tuned by controlling the elemental composition within the epitaxially grown crystal. For example, it has been determined that epitaxial SiGe films containing a concentration of germanium in the range of 25%-40% begin to provide enhanced electron mobility compared with lower Ge concentration SiGe films. Thus, for improved device performance, it is generally advantageous to increase the percent concentration of Ge atoms in a SiGe channel fin of an FET.

There are technical hurdles that must be overcome when attempting to form high carrier mobility p-type channel fins and high carrier mobility n-type channel fins on the same substrate. For example, with continued scaling, fin channels are being formed with increasingly high aspect ratios. However, forming high aspect ratio, high mobility SiGe channel fins can be difficult because the lattice structures of high Ge concentration (e.g., Ge>about 50%) films tend to be mechanically unstable, especially if they contain a high number of dislocation type defects. In other words, after growing SiGe to a certain level of thickness, defects begin to form, and these defects are proportional to the concentration of Ge in the SiGe. Thus, there is generally an inverse relationship between the concentration of Ge in the SiGe layer and the thickness (or height) to which the SiGe layer can be grown without introducing too many defects. Additionally, the thermal budget for fabricating FETs from III-V compound materials without damaging the III-V compound materials is generally less than about 600 Celsius. Because the thermal budget for fabricating FETs from SiGe conventionally exceeds 900 Celsius, it can be difficult to co-integrate high carrier mobility SiGe channel PFETs and high carrier mobility III-V channel NFETs on the same substrate.

Turning now to an overview of aspects of the present invention, embodiments of the invention provide improved fabrication methods and resulting structures for the co-integration of high carrier mobility PFETs and high carrier mobility NFETs on the same substrate using a low temperature (e.g., a temperature about 500 Celsius or less) condensation process. In embodiments of the invention, the high carrier mobility PFET is formed with a high aspect ratio SiGe channel at an initial Ge concentration, and the low temperature condensation process is applied to increase the Ge concentration in the SiGe channel above about 50%. In embodiments of the invention, an aspect ratio trapping (ART) process is used to form the high aspect ratio SiGe channel at the initial Ge concentration. In an ART process used in accordance with aspects of the invention, the high aspect ratio SiGe channel is epitaxially grown from the underlying substrate within a trench formed over a portion of the underlying substrate. Forming the SiGe channel within the trench forces defects in the high aspect ratio SiGe channel to concentrate toward a bottom region of the high aspect ratio channel. The material used to define the trench is recessed sufficiently to expose a low-defect upper region of the high aspect ratio SiGe channel. A low temperature condensation process can be applied to the exposed low-defect upper region of the SiGe channel to increase the Ge concentration in the low-defect upper region of the SiGe channel to a desired Ge concentration level that is above about 50%.

In embodiments of the invention, the high carrier mobility NFET is formed with a high aspect ratio channel formed from a III-V compound material (i.e., a III-V channel). In embodiments of the invention, an ART process is used to form the III-V channel by epitaxially growing the high aspect ratio III-V channel from the underlying substrate within a trench formed over a portion of the underlying substrate. In embodiments of the invention where the underlying substrate is Si, the III-V material is not sufficiently lattice matched to Si to allow the III-V channel to be grown from the Si substrate. Accordingly, in embodiments of the invention, a buffer region is epitaxially grown in the trench from the Si substrate, and the III-V channel is epitaxially grown in the trench from the buffer region. The buffer region is selected to have a lattice structure that is sufficiently close to Si to allow the buffer region to be epitaxially grown from Si. The buffer region is selected to also have a lattice structure that is sufficiently close to the III-V channel material to allow the III-V material to be epitaxially grown from the buffer region. The material used to define the trench is recessed sufficiently to expose an upper region of the III-V channel material for subsequent fabrication operations. In embodiments of the invention, the buffer region can be InP or InAlAs, and the III-V channel material can be InGaAs, GaAs, or InAs.

In embodiments of the invention, after recessing the material that defines the trenches in which the SiGe channel and the III-V channel have been formed, the upper region of the SiGe channel and the upper region of the III-V channel are exposed. At this stage of the fabrication operation, the low temperature condensation process has not yet been applied, and both the upper and lower regions of the SiGe channel are at the initial Ge concentration level. To protect the exposed upper region of the III-V channel during the low temperature Ge condensation process, a protective layer (e.g., AlO) is deposited over the exposed upper region of the III-V channel.

The low temperature Ge condensation process according to aspects of the invention includes depositing a layer that includes an oxide of the Ge component of the SiGe channel (e.g., $GeO_2$) over the low-defect, exposed upper regions of the SiGe channel and the protective layer that covers the exposed upper region of the III-V channel. The protective layer material is selected to be a material (e.g., AlO) that will not react with the $GeO_2$ layer during the condensation process. At least one anneal operation is applied, wherein the at least one anneal operation is sufficient to result in the $GeO_2$ layer and the exposed upper region of the SiGe channel interacting to drive Ge from the $GeO_2$ layer into the exposed upper region of the SiGe channel, thereby increasing the Ge concentration in the exposed upper region of the SiGe channel. The at least one anneal also drives Si from the exposed upper region of the SiGe channel into the $GeO_2$ layer, which begins to covert the $GeO_2$ layer to $SiO_2$. In some embodiments of the invention, the at least one anneal operation includes a first anneal at a first predetermined temperature (e.g., about 550 Celsius). In embodiments of the invention, the at least one anneal operation further includes a second anneal at a second predetermined temperature, wherein the second predetermined temperature is less than the first predetermined temperature. In embodiments of the invention, the at least one anneal operation(s) is in an inert gas ambient environment (e.g., nitrogen, argon, helium, neon, hydrogen).

Figure 14:
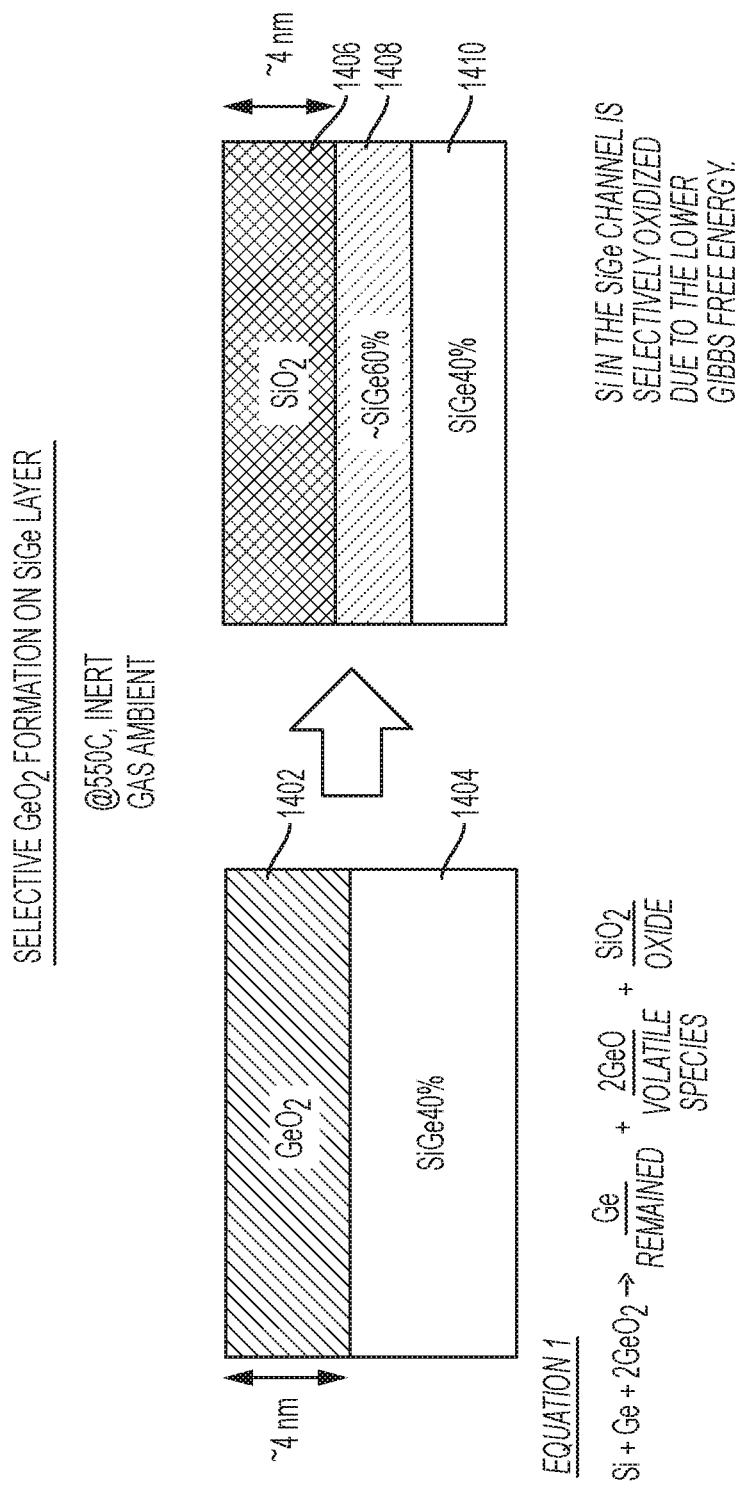
FIG. 14 depicts a diagram illustrating the selective formation of a silicon dioxide layer from an anneal-driven reaction between germanium dioxide and silicon germanium according to embodiments of the invention.

FIG. 14 depicts a diagram illustrating an example of the above-described selective formation of a $SiO_2$ layer from an anneal-driven reaction between $GeO_2$ and SiGe. As shown in FIG. 14, the pre-anneal structure is a $GeO_2$ layer 1402 over a SiGe 20% layer 1404, which is over a Si layer 1412. The notation "SiGe20%" indicates that the SiGe material contains 20% Ge and 80% Si. The post-anneal structure is a SiO₂ layer 1406 over a SiGe40% layer 1408, which is over a SiGe 20% layer 1410. The SiGe 20% layer 1410 is over the Si layer 1412.

The anneal reaction proceeds according to Equation 1 shown in FIG. 14. The GeO₂ layer 1402 will react with the SiGe 20% layer 1404, thus leading to a condensation of Ge and converting the GeO₂ layer 1402 to SiO₂, thereby forming the SiO₂ layer 1406. As the reaction proceeds, more Si in the SiGe20% layer 1404 is oxidized to SiO₂, and the surface of the SiGe20% layer 1404 is continuously enriched with additional Ge. The additional Ge flowing into the SiGe20% layer 1404 leads to a condensation of Ge that spreads inward from the surface interface between the layers 1402, 1404. As the reaction proceeds, and the Ge concentration in the SiGe layer 1408 continues to increase until the desired ratios are reached.

In embodiments of the invention, the condensation process depicted in FIG. 14 can be well-controlled, as the reaction of GeO₂ with the SiGe only occurs during the low temperature anneal. The selective SiO₂ formation in this manner is self-limited and will continue until either all of the GeO₂ is consumed or the SiGe surface becomes sufficiently enriched with germanium that the Equation 1 reaction cannot proceed. For example, if a relatively thick GeO₂ layer is used, the reaction will stop when available Si atoms are not enough at the SiGe surface. Consequently, the severity of the condensation process can be tuned by adjusting the thickness of the GeO₂ layer that has been deposited on the SiGe channel, or by adjusting the anneal temperature/duration.

Figure 15:
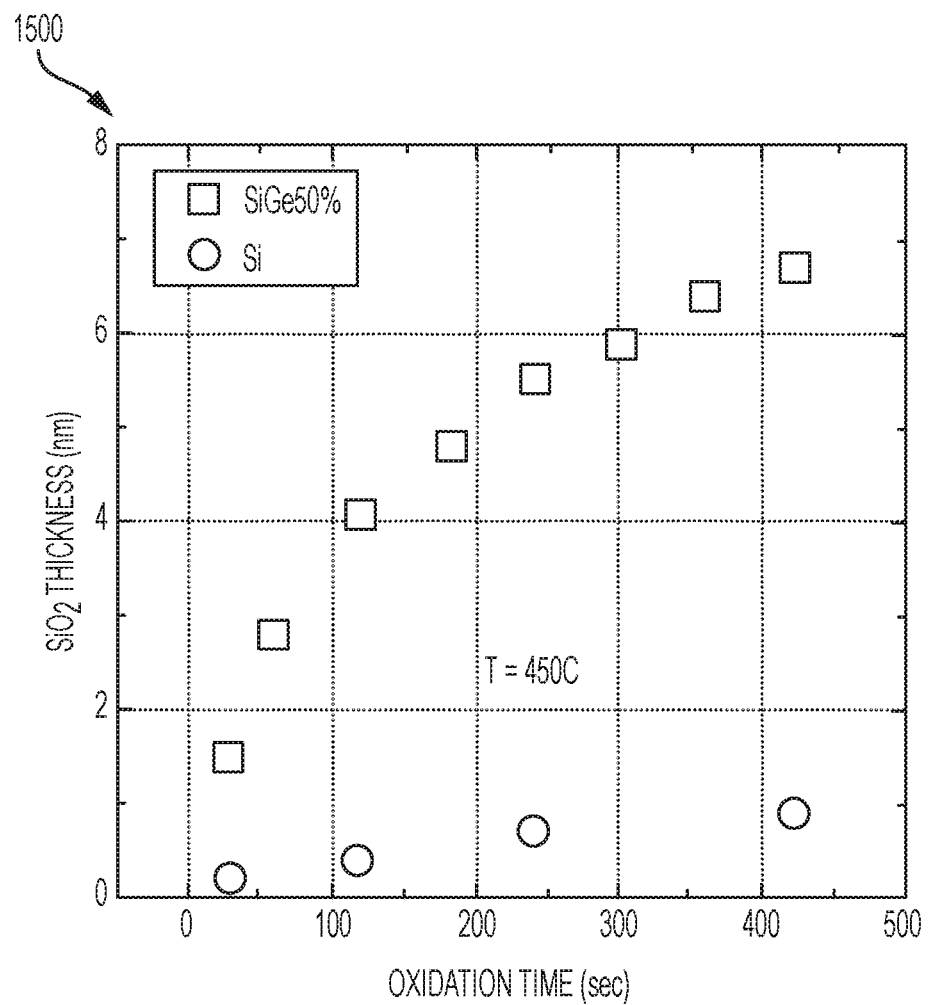
FIG. 15 depicts a diagram illustrating how a high germanium content silicon-germanium layer can be oxidized at low temperatures according to embodiments of the invention.

The III-V channel is protected during the condensation process by a material (e.g., AlO or SiO₂) that does not react with GeO₂. At the anneal temperatures described herein, there is no reaction of GeO₂ with pure Si, and there is no damage to the III-V material that forms the upper region of the III-V channel. Accordingly, the condensation process according to aspects of the invention is highly selective to SiGe, and is compatible with the thermal budget that is required to avoid damaging III-V compound materials. FIG. 15 depicts a chart 1500, which demonstrates various parameters for oxidizing high-Ge content (e.g., >about 50%) SiGe at low temperatures (e.g., at or below about 550 Celsius). After the necessary reactions in Equation 1 (shown in FIG. 14) have completed, the unreacted GeO₂ can be easily removed by exposing it to a water containing wash because GeO₂ is water soluble. The SiO₂ that results from the condensation process can be removed by any suitable process, including, for example, a diluted HF (DHF), a buffered oxide etch (BOE), and like.

Known semiconductor fabrication processes are applied to the PFET regions and the NFET regions of the substrate to form the remaining portions of the PFETs and NFETs (e.g., source, drain, dummy gates, gate dielectrics, replacement metal gate, contacts, and the like). In accordance with aspects of the invention, the high-Ge content SiGe channel fins and the III-V compound channel fins can be advantageously provided with a common high-k stack (e.g. Al₂O₃/HfO₂), which significantly simplifies device integration, reduces costs, and improves yields.

Figure 2:
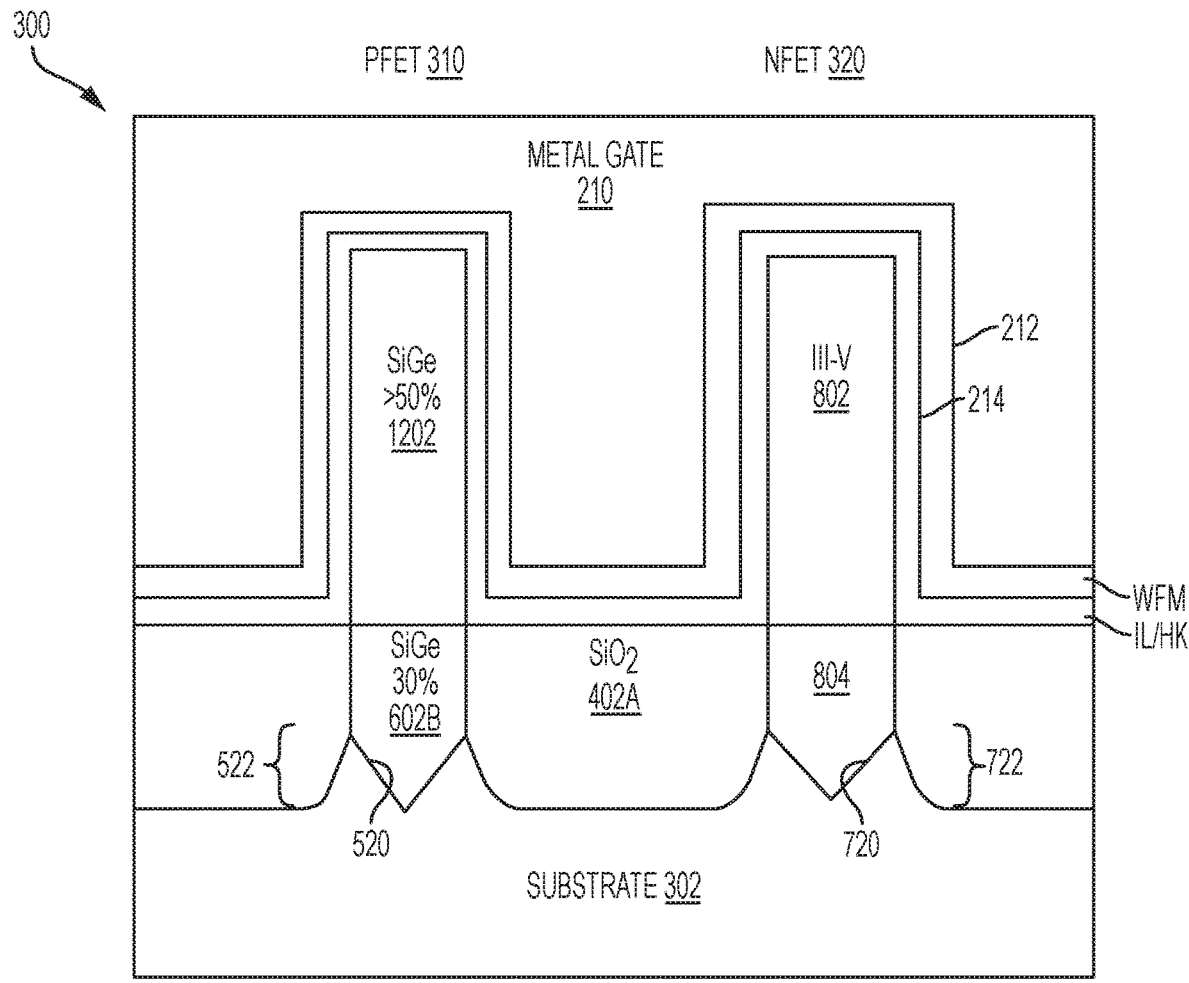
FIG. 2 depicts a cross-sectional view of high mobility PFETs and high mobility NFETs formed on the same substrate according to embodiments of the invention.

The fabrication operations in accordance with embodiments of the invention result in unique and beneficial structures in the final PFET and NFET devices. For example, high aspect ratio SiGe channel fins and high aspect ratio III-V compound channel fins will be formed on the same substrate using a co-integrated fabrication process. The high aspect ratio SiGe channel fin is provided in multiple segments, including an upper active region having low-defects and high-Ge concentration (e.g., above about 50% Ge concentration), along with a lower inactive region having higher defects than the upper region and a low-Ge concentration (e.g., below about 50% Ge concentration. The high aspect ratio III-V compound channel fin is also provided in multiple segments, including an upper active region, along with a buffer region configured to provide a lattice structure that is sufficiently compatible with the underlying substrate and the III-V compound material to allow the buffer region to be epitaxially grown from the underlying substrate, and to allow the III-V compound material to be epitaxially grown from the buffer region. Application of the ART process in accordance with aspects of the invention results in a faceted (e.g., about 54.74 degrees) interface between the underlying substrate and the lower region of the SiGe channel, along with a faceted (e.g., about 54.74 degrees) interface between the underlying substrate and the buffer region of the III-V compound channel Turning now to a more detailed description of aspects of the invention, FIG. 2 depicts a cross-sectional view of a semiconductor structure 300 having a PFET region 310 and an NFET region 320 formed on the same substrate 302. In the depicted embodiments, the high mobility PFET devices in the PFET region 310, along with the high mobility NFET devices in the NFET region 320, are formed as FinFET structures. Although the structure 300 shown in FIG. 2 is a two-dimensional depiction, it is understood that the high mobility PFET devices and the high mobility NFET devices of the semiconductor structure 300 have many of the same three-dimensional features as the three-dimensional view of the FinFET device 106 shown in FIG. 1. The cross-sectional view of the semiconductor structure 300 shown in FIG. 2 is taken along a line that cuts laterally along the metal gate 210 to show the portions of the high mobility fins (e.g., 1202, 602B, 802, 804) that are under the metal gate 210 and form the respective channel fins of the PFET region 310 and the NFET region 320. Additionally, although not shown in FIG. 2, a three-dimensional view of the high mobility channel fins (e.g., 1202, 602B, 802, 804) would include source regions and drain regions formed at opposite ends of the high mobility channel fins (e.g., 1202, 602B, 802, 804), which is similar in structure to the source 108 and the drain 110 positioned at opposite ends of the channel fin 112 shown in FIG. 1. Although one example of the high mobility PFET devices is shown in FIG. 2, any number of high mobility PFET devices can be provided in the PFET region 310. Similarly, although one example of the high mobility NFET devices is shown in FIG. 2, any number of high mobility NFET devices can be provided in the NFET region 320. In the descriptions provided herein, a reference to the PFET region 310 or the NFET region 320 is a reference to the complete structure shown in either the PFET region 310 or the NFET region 320.

Figure 7:
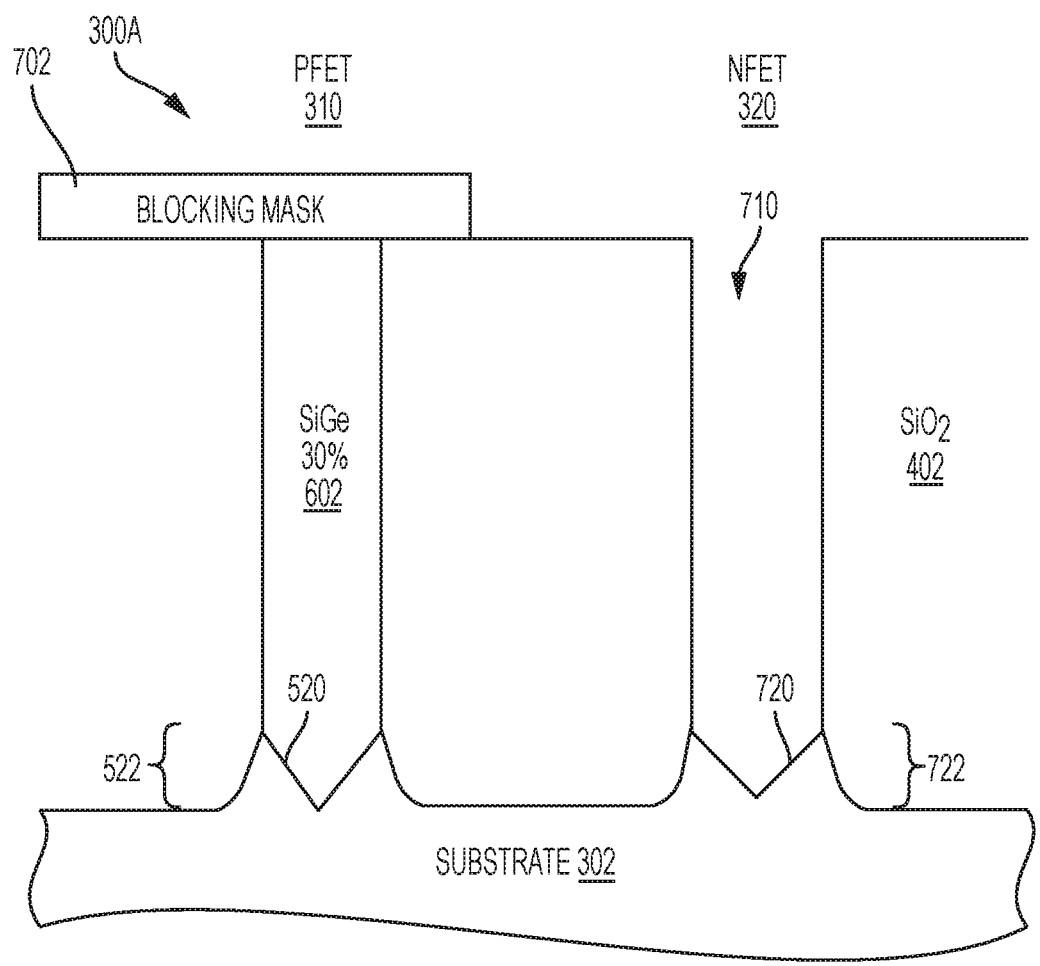

The semiconductor structure 300 shown in FIG. 2 includes a substrate 302 having the PFET region 310 and the NFET region 320 formed thereon. A gate dielectric stack 214, a work function metal (WFM) 214, and a metal gate 210 are shared between the PFET region 310 and the NFET region 320. The gate dielectric stack 214 can include interfacial layers (IL) and high-k dielectric layers. Shallow trench isolation (STI) (not shown) isolate the high mobility PFET/NFET devices from one another. A dielectric region 402A is also provided. The high mobility PFET region/device 310 includes a high aspect ratio SiGe channel fin formed from a low-defect, high-Ge concentration upper SiGe channel region 1202, along with a low-Ge concentration lower SiGe channel region 602B. The lower SiGe channel region 602B interfaces with a raised portion 522 of the substrate 302 at a faceted interface 520. In embodiments of the invention, the raised portion 522 of the substrate 302 and the faceted interface 520 result from the application of an ART fabrication process, which is depicted in FIGS. 3-5 and described in detail subsequently herein. Similarly, the high mobility NFET region/device 320 includes a high aspect ratio III-V compound channel fin formed from a III-V compound active upper channel region 802, along with a buffer region 804, which interfaces with a raised portion 722 of the substrate 302 at a faceted interface 720. In embodiments of the invention, the raised portion 722 of the substrate 302 and the faceted interface 720 result from the application of an ART fabrication process, which is depicted in FIGS. 6-7 and described in detail subsequently herein.

FIGS. 3-12 depict various cross-sectional views of a semiconductor structure 300A showing the results of fabrication operations for forming the high mobility PFET fin channels (e.g., 1202, 602B) and the high mobility NFET fin channels (e.g., 802, 802) on the substrate 302 according to embodiments of the invention. In FIG. 3, known semiconductor fabrication operations have been used to form multiple Si fins (e.g., Si fin 312) in the PFET region 310, along with multiple Si fins (e.g., Si fin 314) in the NFET region 320. A variety of well-known semiconductor fabrication operations are suitable for producing the fins 312, 314 in the substrate 302 so the details of an example fabrication operation have been omitted in the interest of brevity.

In FIG. 4, known semiconductor fabrication operations have been used to form dielectric regions 402 between the fins 312, 314. For example, a dielectric material (e.g., $SiO_2$) can be deposited over the semiconductor structure 300A then planarized (e.g., using chemical mechanical planarization (CMP)) to form the dielectric regions 402.

In FIG. 5, known fabrication operations have been used to deposit a blocking mask 502 over the NFET region 320 and remove the fin 312, thereby forming a trench 510, the raised portion 522 of the substrate 302, and the faceted interface 520. In embodiments of the invention, the faceted interface 520 includes (111) orientation surface facets as shown. The fin 312 can be removed/etched using any process that removes material. Example removal processes include etch processes (either wet or dry). In embodiments of the invention, the silicon fin 312 can be etched using a wet etch formed from KOH.

In FIG. 6, known FET fabrication techniques have been used to remove the blocking mask 502 (shown in FIG. 5) and grow a SiGe fin 602 in the trench 510 (shown in FIG. 5) over the raised portion 522 of the substrate 302 and between the dielectric regions 402. In embodiments of the invention, the SiGe fin 602 includes a low Ge-concentration below about 50% (e.g., about 30% Ge concentration). Because of the required height of the SiGe fin 602 (e.g., about 50 nm to about 200 nm), as well as the lattice constant mismatch (e.g., about 3%) between Si and SiGe, defects are present in the SiGe fin 602 if it is grown to include about a 30% Ge concentration. However, because the SiGe fin 602 is grown within the trench 510 (shown in FIG. 5) using an ART process, these defects are substantially confined at a lower region of the SiGe fin 602 in accordance with embodiments of the invention.

In embodiments of the invention, the SiGe fin 602 can be grown epitaxially. Epitaxial materials can be grown from gaseous or liquid precursors. Epitaxial materials can be grown using vapor-phase epitaxy (VPE), molecular-beam epitaxy (MBE), liquid-phase epitaxy (LPE), or other suitable process. Epitaxial silicon, silicon germanium, and/or carbon doped silicon (Si:C) can be doped during deposition (in-situ doped) by adding dopants, n-type dopants (e.g., phosphorus or arsenic) or p-type dopants (e.g., boron or gallium), depending on the type of transistor.

The phrases "epitaxial growth and/or deposition" and "epitaxially formed and/or grown" mean the growth of a semiconductor material (crystalline material) on a deposition surface of another semiconductor material (crystalline material) in which the semiconductor material being grown (crystalline overlayer) has substantially the same crystalline characteristics as the semiconductor material of the deposition surface (seed material). In an epitaxial deposition process, the chemical reactants provided by the source gases are controlled and the system parameters are set so that the depositing atoms arrive at the deposition surface of the semiconductor substrate with sufficient energy to move about on the surface such that the depositing atoms orient themselves to the crystal arrangement of the atoms of the deposition surface. Therefore, an epitaxially grown semiconductor material has substantially the same crystalline characteristics as the deposition surface on which the epitaxially grown material is formed. For example, an epitaxially grown semiconductor material deposited on a <100> orientated crystalline surface will take on a <100> orientation. In some embodiments of the invention, epitaxial growth and/or deposition processes are selective to forming on semiconductor surface, and generally do not deposit material on exposed surfaces, such as silicon dioxide or silicon nitride surfaces.

In some embodiments of the invention, the gas source for the deposition of epitaxial semiconductor material include a silicon containing gas source, a germanium containing gas source, or a combination thereof. For example, an epitaxial Si layer can be deposited from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. An epitaxial germanium layer can be deposited from a germanium gas source that is selected from the group consisting of germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, nitrogen, helium and argon can be used.

In FIG. 7, known fabrication operations have been used to deposit a blocking mask 702 over the PFET region 310 and remove the fin 314, thereby forming a trench 710, the raised portion 722 of the substrate 302, and the faceted interface 720. In embodiments of the invention, the faceted interface 720 includes (111) orientation surface facets as shown. The fin 314 can be removed/etched using any process that removes material. Example removal processes include etch processes (either wet or dry). In embodiments of the invention, the silicon fin 314 can be etched using a wet etch formed from KOH.

Figure 8:
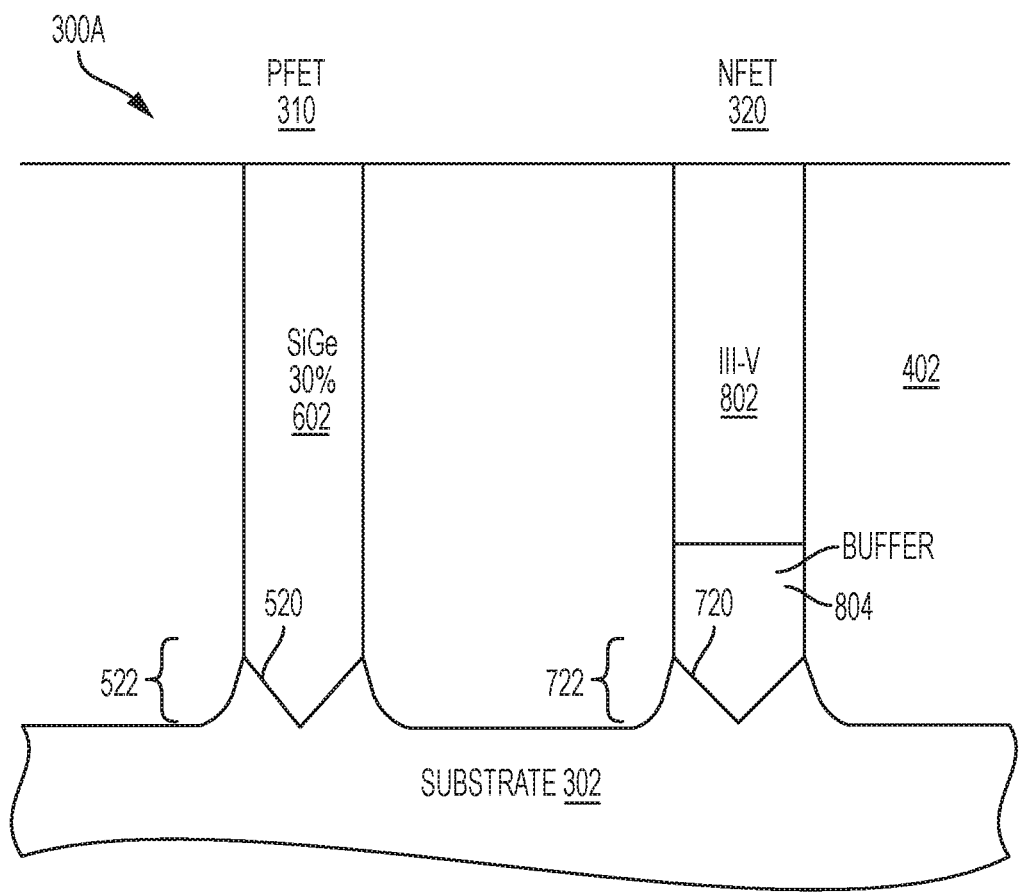

In FIG. 8, known FET fabrication techniques have been used to remove the blocking mask 702 (shown in FIG. 7) and form the buffer region 804 in the trench 710 (shown in FIG. 7) over the raised portion 722 of the substrate 302 and between the STI regions 402. The III-V compound region 802 is formed over the buffer region 804 and between the dielectric regions 402. In embodiments of the invention, the buffer region 804 and the III-V compound region 802 are epitaxially grown. In embodiments of the invention where the substrate 302 is Si, the III-V compound region 802 is not sufficiently lattice matched to Si to allow the III-V compound region 802 to be epitaxially grown from the Si substrate 302. Accordingly, in embodiments of the invention, the buffer region 804 is epitaxially grown in the trench 710 from the Si substrate 302, and the III-V compound region 802 is epitaxially grown in the trench 710 from the buffer region 804. In accordance with aspects of the invention, the buffer region 804 is selected to have a lattice structure that is sufficiently close to Si to allow the buffer region 804 to be epitaxially grown from Si. The buffer region 804 is selected to also have a lattice structure that is sufficiently close to the III-V compound region 802 to allow the III-V compound region 802 to be epitaxially grown from the buffer region 804. In embodiments of the invention, the buffer region 804 can be InP or InAlAs, and the III-V compound region 802 can be InGaAs, GaAs, InAs, or similar III-V compounds.

Figure 9:
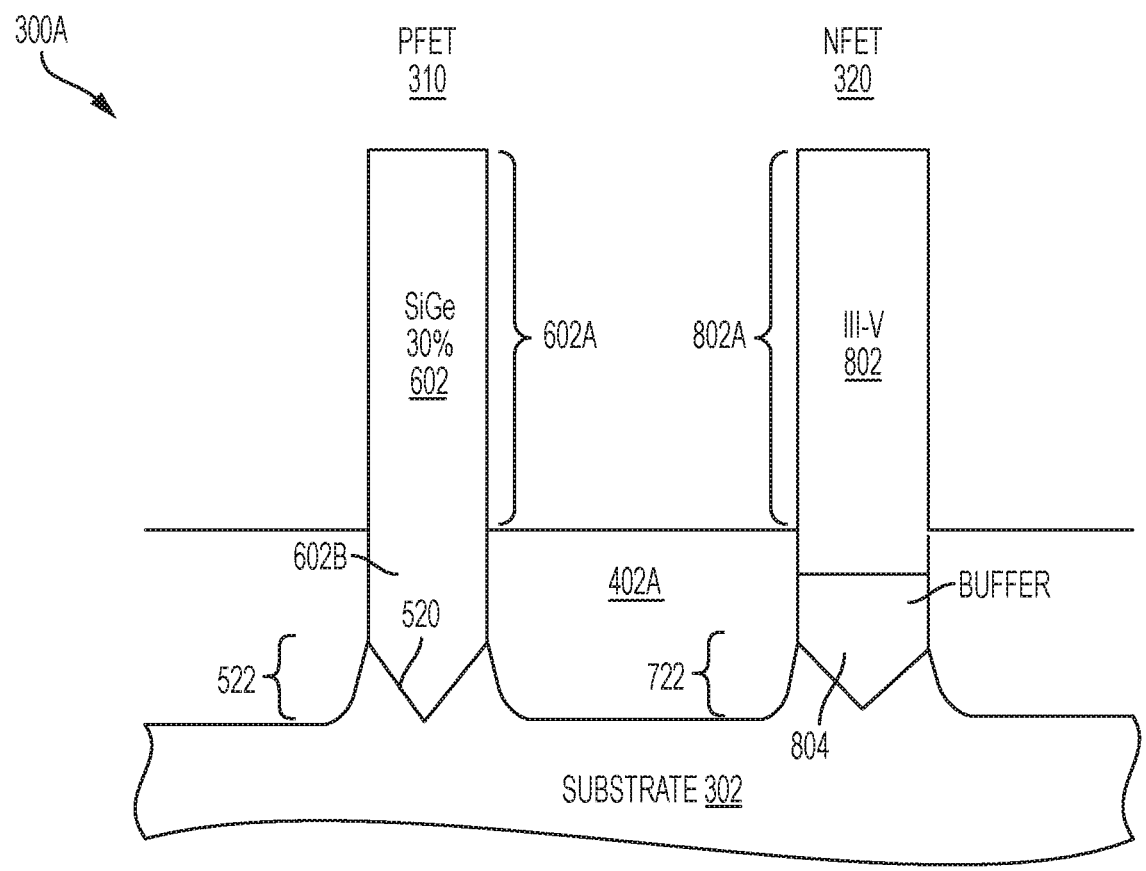

In FIG. 9, known semiconductor fabrication techniques have been used to recess (e.g., using wet chemicals) the dielectric regions 402 (shown in FIG. 8) to form dielectric regions 402A and expose an upper region 602A of the SiGe fin 602, and also expose an upper region 802A of the III-V compound region 802. A lower region 602B of the SiGe fin 602 is the portion of the SiGe fin 602 that is below a top surface of the dielectric regions 402A. At this stage of the fabrication operation, both the upper and lower regions 602A, 602B of the SiGe fin 602 are at still at a Ge concentration level that is below 50% Ge (e.g., about 30% Ge concentration).

Figure 10:
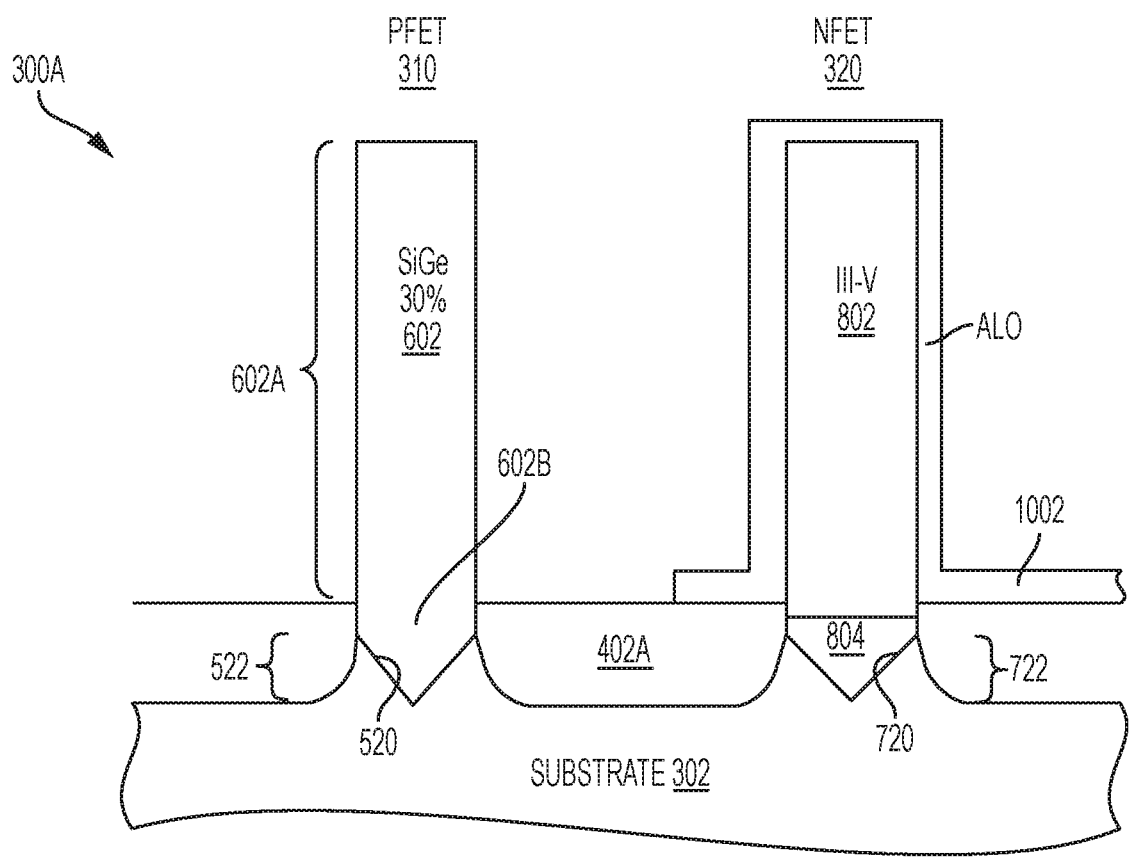
Figure 11:
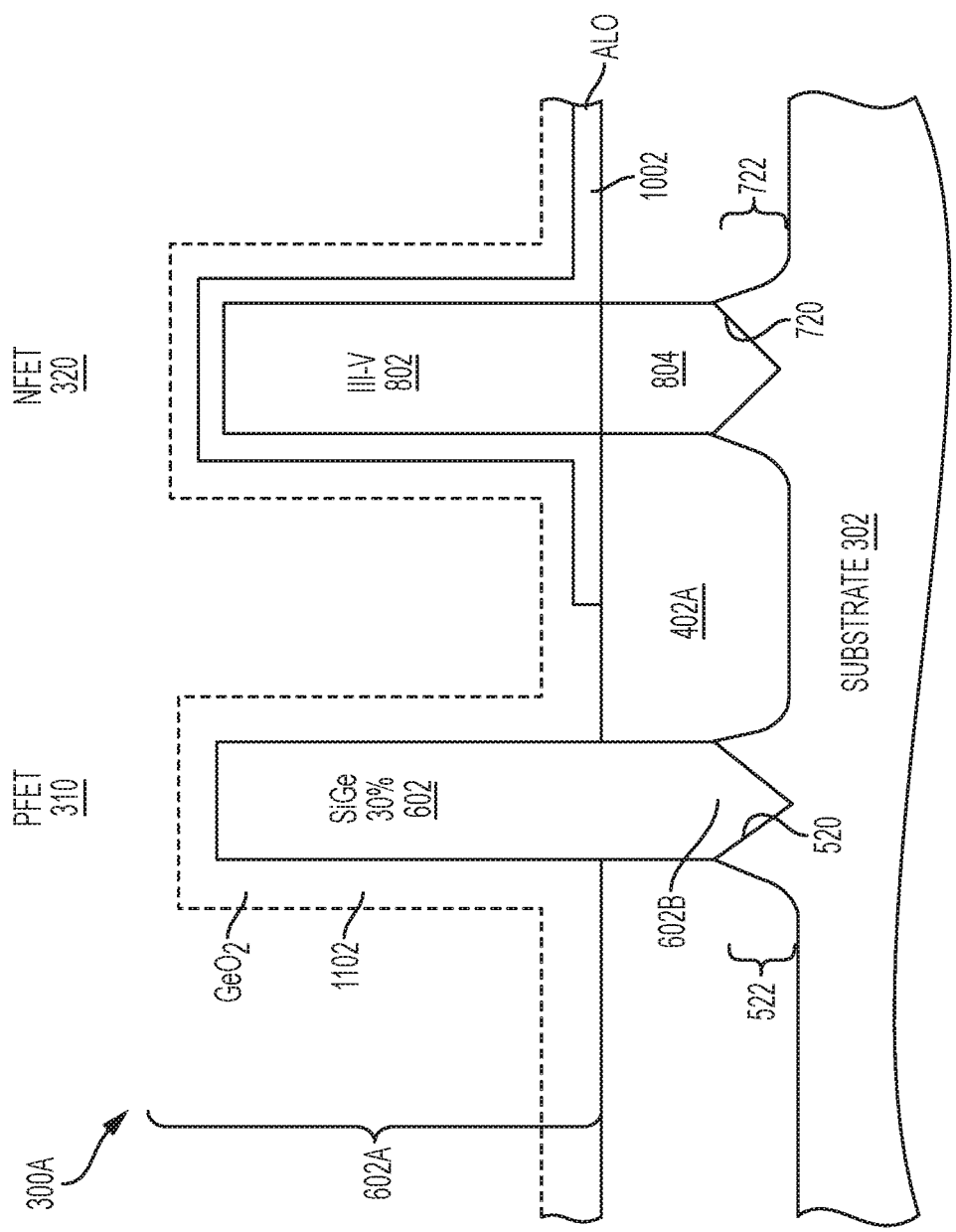
Figure 12:
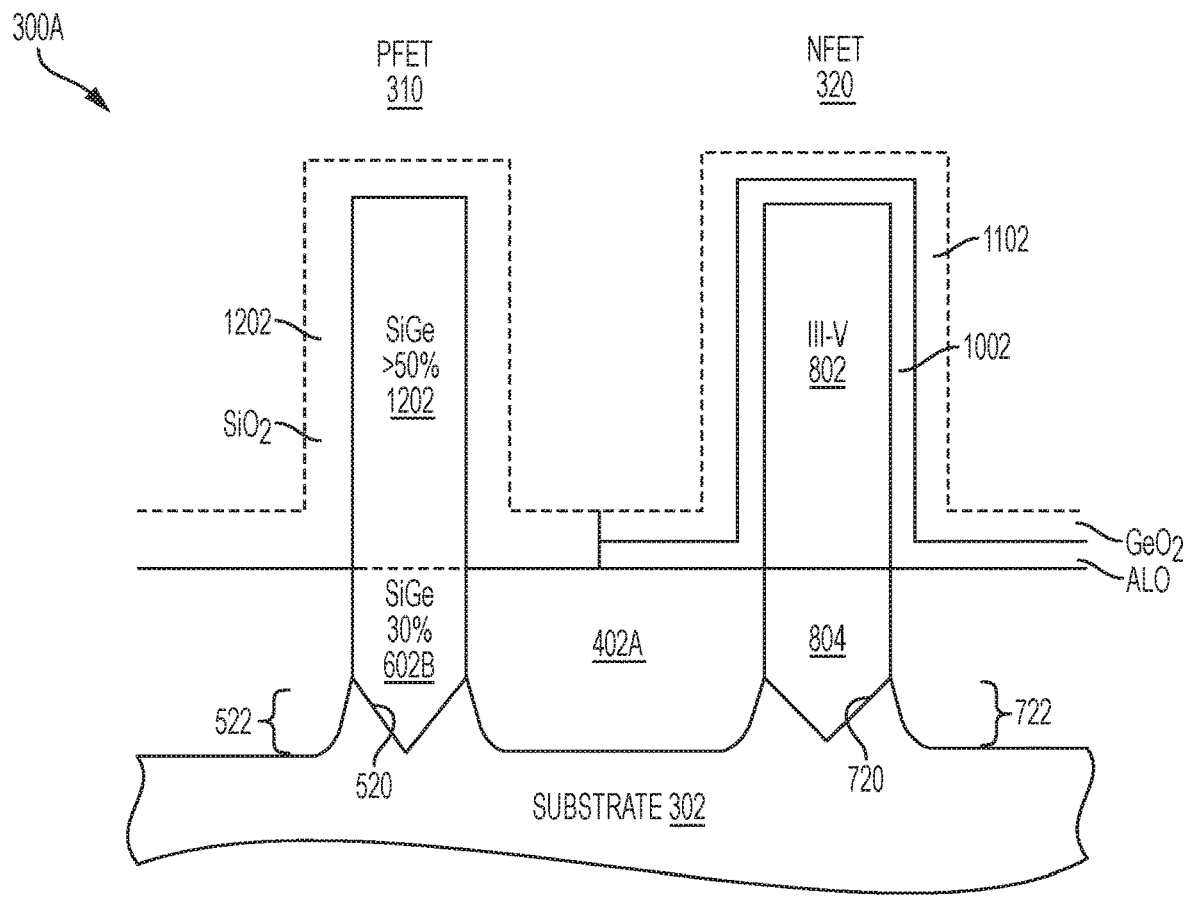

In FIG. 10, known fabrication operations have been used to deposit a protective layer 1002 over the exposed upper region 802A of the III-V compound region 802 to protect the III-V compound region 802 during the low temperature Ge condensation process (shown in FIGS. 11 and 12). In embodiments of the invention, the protective layer 1002 is formed from a protective material (e.g., AlO) that will not react with the $GeO_2$ layer 1102 (shown in FIG. 11) that is deposited during the low temperature Ge condensation process (shown in FIGS. 11 and 12).

In FIG. 11, known fabrication operations (e.g., ALD) have been used to conformally deposit the $GeO_2$ layer 1102 over the semiconductor structure 300A. More specifically, the $GeO_2$ layer 1102 is deposited over an exposed upper surface of the dielectric regions 402A, the exposed upper region 602A of the SiGe fin 602, and the protective layer 1002.

In FIG. 12, a low temperature anneal (e.g., about 500-550 Celsius) has been applied to the semiconductor structure 300A in an inert gas ambient environment (e.g., nitrogen, argon, helium, neon, hydrogen). In embodiments of the invention, the low temperature anneal includes a spike anneal applied to the semiconductor structure 300A at about 500-550 degrees Celsius in an $N_2$ ambient. Following the Equation 1 reaction described previously herein and illustrated in FIG. 14, $GeO_2$ in the layer 1102 (shown in FIG. 11) that contacted SiGe in the upper region 602A of the SiGe fin 602 (shown in FIG. 11) converts to $SiO_2$ with Ge condensation, thereby forming a $SiO_2$ region/layer 1202 and a high-Ge concentration (e.g., above about 50% Ge concentration) SiGe region 1202. FIG. 15 depicts a chart 1500, which demonstrates various parameters for oxidizing high-Ge content SiGe at low temperatures.

Figure 13:
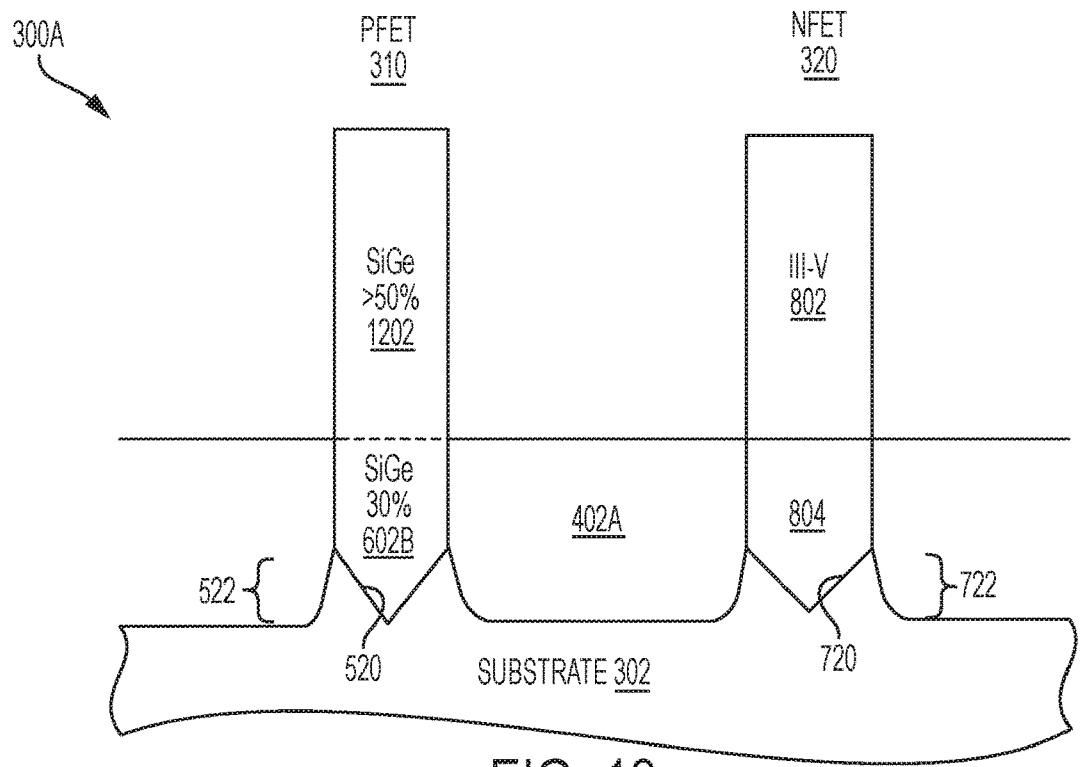

In FIG. 13, known semiconductor fabrication techniques have applied to the semiconductor structure 300A to remove the $SiO_2$ layer 1202, the unreacted portions of the $GeO_2$ layer 1102, and the protective layer 1002. The $SiO_2$ layer 1202 and the protective layer 1002 can be removed by any suitable process, including, for example, a diluted DHF process, a buffered oxide etch (BOE) process, and the like. The unreacted portion of the $GeO_2$ layer 1102 can be removed by exposing it to a water containing wash because $GeO_2$ is water soluble.

Known semiconductor fabrication operations are applied to the semiconductor structure 300A at the fabrication stage shown in FIG. 13 to deposit the gate dielectric layer 214, the WFM 212, and the metal gate 210, thereby forming the semiconductor structure 300 shown in FIG. 2. The gate dielectric 214 can be formed from one or more high-k dielectric films (not shown). The high-k dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k dielectric films can further include dopants such as, for example, lanthanum and aluminum. The high-k dielectric films can be formed by suitable deposition processes, for example, CVD, PECVD, atomic layer deposition (ALD), evaporation, physical vapor deposition (PVD), chemical solution deposition, or other like processes. The thickness of the high-k dielectric films that form the gate dielectric layer 214 can vary depending on the deposition process as well as the composition and number of high-k dielectric materials used.

The WFM layer 212 can be deposited over the gate dielectric layer 214 by a suitable deposition process, for example, ALD, CVD, PECVD, PVD, plating, thermal or e-beam evaporation, and sputtering. In some embodiments of the invention, the same WFM is used in the PFET region 310 and the NFET region 320. In some embodiments of the invention, the type of WFM depends on the type of transistor and differs between the PFET region 310 and the NFET region 320. P-type WFMs include compositions such as titanium nitride, tantalum nitride, ruthenium, palladium, platinum, cobalt, nickel, and conductive metal oxides, or any combination thereof. N-type WFMs include compositions such as hafnium, zirconium, titanium, tantalum, aluminum, metal carbides (e.g., hafnium carbide, zirconium carbide, titanium carbide, and aluminum carbide), aluminides, or any combination thereof. The WFM layer 212 can be deposited by a suitable deposition process, for example, ALD, CVD, PECVD, PVD, plating, thermal or e-beam evaporation, and sputtering.

The metal gate 210 can be formed as part of a replacement metal gate (RMG) process in which a dummy gate (not shown) is used as a placeholder for the metal gate 210 until the final fabrication operations in which the dummy gate is replaced with the metal gate 210. The dummy gate is fabrication from a material (e.g., polycrystalline Si) that is more compatible with CMOS processing operations than metals.

The methods described herein are used in the fabrication of IC chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, can be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (rotated 90 degrees or at other orientations) and the spatially relative descriptors used herein interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer) means that the thickness of the layer is substantially the same on all surfaces, or that the thickness variation is less than 15% of the nominal thickness of the layer.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of fabricating semiconductor devices, the method comprising:
   forming a first fin in a p-type field effect transistor (PFET) region of a substrate, wherein the first fin comprises a first material that includes a first type of semiconductor material at a first concentration level;
   forming a second fin in an n-type FET (NFET) region of the substrate, wherein the second fin comprises a second semiconductor material comprising a III-V compound; and
   performing condensation operations configured to increase the first concentration level in at least a portion of the first fin to a targeted final concentration level;
   wherein performing the condensation operations comprises:
      depositing a protective layer over the second fin;
      depositing over the portion of the first fin and the protective layer a layer comprising an oxide of the first type of semiconductor material; and
      applying at least one anneal operation to drive the first type of semiconductor material from the oxide of the first type of semiconductor material into the portion of the first fin, thereby causing the increase in the first concentration level in the portion of the first fin;
      wherein the protective layer is configured to not react with the layer comprising the oxide of the first type of semiconductor material, thereby preventing the first type of semiconductor material from being driven from the oxide of the first type of semiconductor material into the second fin.

2. The method of claim 1, wherein the at least one anneal operation is performed in an inert gas environment.

3. The method of claim 2, wherein the inert gas is selected from a group consisting of nitrogen, argon, helium, and neon.

4. The method of claim 1, wherein the at least one anneal operation comprises an anneal temperature that is within a thermal budget selected to not cause damage to the second semiconductor material comprising the III-V compound.

5. The method of claim 4, wherein the anneal temperature comprises less than or equal to about 550 Celsius.

6. The method of claim 1, wherein the first semiconductor material comprises germanium.

7. The method of claim 1, wherein the III-V compound is selected from a group consisting of InGaAs, GaAs, and InAs.

8. The method of claim 1, wherein forming the second fin comprises:
   forming a buffer region of the second fin over a segment of the substrate; and
   forming a top region of the second fin over the buffer region.

9. The method of claim 8, wherein:
   the segment of the substrate comprises a substrate lattice structure;
   the buffer region comprises a buffer region lattice structure; and
   the top region comprise a top region lattice structure.

10. The method of claim 9, wherein:
- the buffer region lattice structure is sufficiently close to the substrate lattice structure to enable the buffer region to be epitaxially grown from the segment of the substrate;
- the top region lattice structure is sufficiently close to the buffer region lattice structure to enable the top region to be epitaxially grown from the buffer region; and
- the top region lattice structure is sufficiently distinct from the substrate lattice structure to prevent the top region from being epitaxially grown from the segment of the substrate.

11. A method of fabricating semiconductor devices, the method comprising:
- forming a first trench over a p-type field effect transistor (PFET) region of a substrate;
- forming a first fin in the first trench, wherein the first fin comprises a first material that includes a first type of semiconductor material at a first concentration level;
- forming a second fin in an n-type FET (NFET) region of the substrate, wherein the second fin comprises a second semiconductor material comprising a III-V compound; and
- performing condensation operations configured to increase the first concentration level in a portion of the first fin to a targeted final concentration level;
- wherein a bottom portion of the first fin comprises the first material that includes the first type of semiconductor material at the first concentration level;
- wherein performing the condensation operation comprises:
  - removing a portion of a fill material that defines the first trench to expose the portion of the first fin;
  - depositing a protective layer over the second fin;
  - depositing over the portion of the first fin and the protective layer a layer comprising an oxide of the first type of semiconductor material; and
  - applying at least one anneal operation to drive the first type of semiconductor material from the oxide of the first type of semiconductor material into the portion of the first fin, thereby causing the increase in the first concentration level in the portion of the first fin;
  - wherein the protective layer is configured to not react with the layer comprising the oxide of the first type of semiconductor material, thereby preventing the first type of semiconductor material from being driven from the oxide of the first type of semiconductor material into the second fin.

12. The method of claim 11, wherein the at least one anneal operation is performed in an environment comprising an inert gas selected from a group consisting of nitrogen, argon, helium, and neon.

13. The method of claim 11, wherein the at least one anneal operation comprises an anneal temperature that is within a thermal budget selected to not cause damage to the second semiconductor material comprising the III-V compound.

14. The method of claim 11, wherein:
- the first semiconductor material comprises germanium;
- the first concentration level is less than or equal to about 50%;
- the targeted final concentration level comprises greater than about 50%; and
- the III-V compound is selected from a group consisting of InGaAs, GaAs, and InAs.

\* \* \* \* \*